United States Patent
Fincato et al.

(10) Patent No.: US 10,422,968 B2
(45) Date of Patent: Sep. 24, 2019

(54) OPTICAL SEMICONDUCTOR CHIP, CORRESPONDING ARRANGEMENT, APPARATUS AND METHOD

(71) Applicant: STMicroelectronics S.r.l., Agrate Brianza (MB) (IT)

(72) Inventors: Antonio Fincato, Cameri (IT); Luca Maggi, Garlate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/985,860

(22) Filed: May 22, 2018

(65) Prior Publication Data

US 2018/0335591 A1 Nov. 22, 2018

(30) Foreign Application Priority Data

May 22, 2017 (IT) .......... 102017000055369

(51) Int. Cl.
| | | |
|---|---|---|
| G02B 6/42 | (2006.01) | |
| H01L 23/58 | (2006.01) | |
| G02B 6/30 | (2006.01) | |
| G02B 6/28 | (2006.01) | |
| G02B 6/12 | (2006.01) | |

(52) U.S. Cl.
CPC ....... *G02B 6/4214* (2013.01); *G02B 6/12002* (2013.01); *G02B 6/2852* (2013.01); *G02B 6/30* (2013.01); *H01L 23/585* (2013.01); *G02B 2006/12147* (2013.01)

(58) Field of Classification Search
None
See application file for complete search history.

(56) References Cited

U.S. PATENT DOCUMENTS

| 6,208,791 B1* | 3/2001 | Bischel ............. G02B 6/12004 385/123 |
|---|---|---|
| 2002/0064345 A1* | 5/2002 | Kikuchi ............ G02B 6/12004 385/50 |
| 2004/0013378 A1 | 1/2004 | Lee et al. |
| 2006/0274314 A1* | 12/2006 | Thomsen .............. B82Y 20/00 356/445 |
| 2008/0129623 A1 | 6/2008 | Barry |

OTHER PUBLICATIONS

Bettotti, Paolo, "Hybrid Materials for Integrated Photonics", Advances in Optics, vol. 2014, Article ID 891395, published Jun. 26, 2014, 24 pages.

Creazzo, Timothy, et al., "Integrated tunable CMOS laser", OSA Publishing, Optics Express, vol. 21, No3 23, Nov. 18, 2013, pp. 28048-28053.

(Continued)

*Primary Examiner* — Chad H Smith
(74) *Attorney, Agent, or Firm* — Slater Matsil, LLP

(57) ABSTRACT

A semiconductor chip provides an optical medium for light propagation. The semiconductor chip includes a chip surface with an outer perimeter and a cavity in the chip surface. The cavity includes a peripheral wall and a bottom surface surrounded by the peripheral wall, the bottom surface adiabatically couplable to an optical waveguide. The cavity is located at an area of the chip surface spaced from the outer perimeter thereof.

23 Claims, 1 Drawing Sheet

(56) References Cited

OTHER PUBLICATIONS

Dhoore, Soren, et al., "Novel adiabatic tapered couplers for active III-V/SOI devices fabricated through transfer printing", Optics Express, vol. 24, No. 12, Jun. 13, 2016, pp. 12976-12990.

La Porta, A., et al., "Silicon Photonics Packaging for Highly Scalable Optical Interconnects", 2015 IEEE 65th Electronic Components and Technology Conference (ECTC), pp. 1299-1304.

Taira, Yoichi, et al., "Improved Connectorization of Compliant Polymer Waveguide Ribbon for Silicon Nanophotonics Chip Interfacing to Optical Fibers", 2015 IEEE 65th Electronic Components and Technology Conference (ECTC), May 26-29, 2015 San Diego, CA, USA, 6 pages.

\* cited by examiner

OPTICAL SEMICONDUCTOR CHIP, CORRESPONDING ARRANGEMENT, APPARATUS AND METHOD

CROSS-REFERENCE TO RELATED APPLICATIONS

This application claims priority to Italian Patent Application No. 102017000055369, filed on May 22, 2017, which application is hereby incorporated herein by reference.

TECHNICAL FIELD

The description relates to optical semiconductor chips such as, e.g., silicon photonics chips.

BACKGROUND

In applications involving silicon photonics optical inputs/output arrangements may be realized, via an adiabatic or "evanescent" coupling. The term adiabatic coupling refers to the fact that transition occurs substantially without loss of energy.

Adiabatic or "evanescent" coupling may involve one or more optical layers realized in, e.g., an optical integrated circuit (OIC) and one or more optical layers realized, e.g., in a medium/support/interposer, external to the OIC. The external medium may be conventionally attached by gluing to the OIC. Setting the distance between the optical layer(s) of the OIC and an external medium/support/interposer to a certain value facilitates making the adiabatic or evanescent coupling effective.

The working principle of such a coupling is based on asymmetric directional couplers (DC), wherein each waveguide changes its cross section and/or refractive index along a direction of propagation.

The effective refractive index $n_{eff}$ is a number quantifying the phase delay per unit length in a waveguide relative to the phase delay in vacuum.

When the effective refractive index (or propagation constant) of a waveguide matches the effective refractive index of a further waveguide, optical coupling may take place.

Examples of adiabatic coupling may be found in:
P. Bettotti, "Hybrid Materials for Integrated Photonics", Advances in Optics, Volume 2014 (2014), Article ID 891395, 24 pages,
S. Dhoore et al., "Novel adiabatic tapered couplers for active III-V/SOI devices fabricated through transfer printing", (2016) OPTICS EXPRESS 24(12). p. 12976-12990,
A. La Porta et al., "Silicon Photonics Packaging for Highly Scalable Optical Interconnects", IEEE 65th Electronic Components and Technology Conference (ECTC), pp. 1299-1304, 2015.

Adiabatic or evanescent coupling between, e.g., an optical chip and an external medium may be considered as a new approach, with few approaches for realizing such coupling being suggested in the art. Such approaches may be suitable for demo samples, however they show inherent weaknesses, possibly incompatible with reliable products.

Also, document T. Creazzo et al.: "Integrated tunable CMOS laser", 2013, Optical Society of America, 28048-28053, may be of interest for one or more embodiments.

SUMMARY

One or more embodiments contribute in further improving adiabatic coupling arrangements, e.g., for facilitating providing high-volume and reliable production.

One or more embodiments may be used in silicon photonics-based applications (e.g., merely by way of example: wavelength domain multiplex—WDM optical engines, coherent transceivers, and common public radio interface—CPRI receivers). For example, one or more embodiments may relate to a corresponding optical coupling arrangement, to a corresponding apparatus (e.g., a WDM optical engine, a coherent transceiver, a CPRI receiver) and to a corresponding method.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
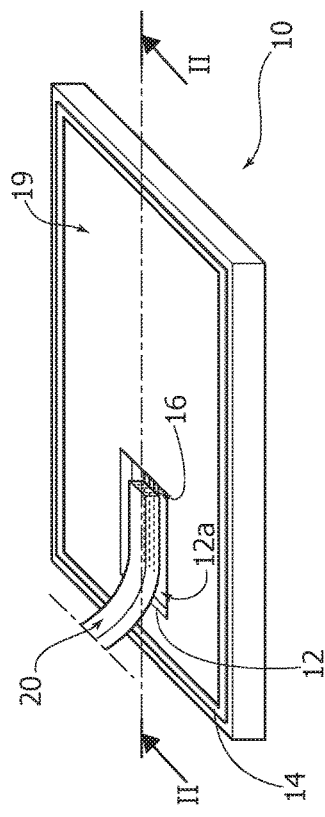
FIG. 1 is a three-dimensional view exemplary of one or more embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Certain types of coupling between polymer waveguides and a silicon photonics based chip (as disclosed, e.g., in Y. Taira et al., "Improved Connectorization of Compliant Polymer Waveguide Ribbon for Silicon Nanophotonics Chip Interfacing to Optical Fibers", 2015 IEEE 65th Electronic Components and Technology Conference (ECTC), 26-29, May 2015 San Diego, Calif., USA) involve an optical flex attached on top of a photonic chip, with the presence of only one optical layer, without addressing issue of providing of a back end of line (BEOL).

The designation BEOL is used to indicate that stage of fabrication of integrated circuits where individual devices (transistors, capacitors, resistors, etc.) are interconnected by means of wiring, electrically conductive layers and so on.

Consequently, real applications based on the principle discussed above may involve, on top of the optical layer of, e.g., the photonic chip, a BEOL layer configured for the routing of electrical signal(s) realized with a thickness of, e.g., several microns (1 micron=10−6 m). Moreover, a seal ring, e.g., a conductive ring configured for electrostatic discharge (ESD) protection, surrounding the chip may be also provided.

It was observed that while a cavity for placing a medium/interposer/support may be realized in the BEOL, such may prove disadvantageous for various reasons, e.g., coupling may be realized only at the edge of the silicon photonics chip. Also, a seal ring may be difficult to realize.

The seal ring may be partially discontinued or partially etched (leading to, e.g., its functionality and ESD protection being compromised), or it may be completed but with a different geometry with respect to the geometry of the silicon photonics chip (leading to, e.g., the function of ESD protection being separated by the "sawing" definition or, in case of semiconductor waveguides, to electrical isolation being possibly incomplete due to the possibility of electrical charges being transported in the silicon photonics chip by the waveguide).

Another possible disadvantage may be related to the difficulty in controlling a bend of the optical flex, to improve coupling.

One or more embodiments address these issues by means of an arrangement as exemplified in the figures.

In the figures, reference 10 indicates a semiconductor, e.g., silicon photonic chip with a cavity 12 provided therein, e.g., by etching, with a seal ring 14 extending around (e.g., completely enclosing) the cavity 12.

It will be appreciated that the cavity 12 is provided-in-the chip 10, that is with the outer contour of the cavity 12 distanced from the periphery of the chip 10. This facilitates providing a seal ring 14 including (e.g., four rectilinear) portions extending along homologous sides of the chip 10, completely enclosing the cavity 12.

In one or more embodiments, an optical "flex" 20 (e.g., a ribbon-shaped arrangement including one or more flexible optical waveguides) may be attached to the cavity 12, e.g., at a bottom surface 12a of the cavity 12, in order to provide an adiabatic coupling to one or more optical waveguides 16 in the chip 10.

Figure 2:
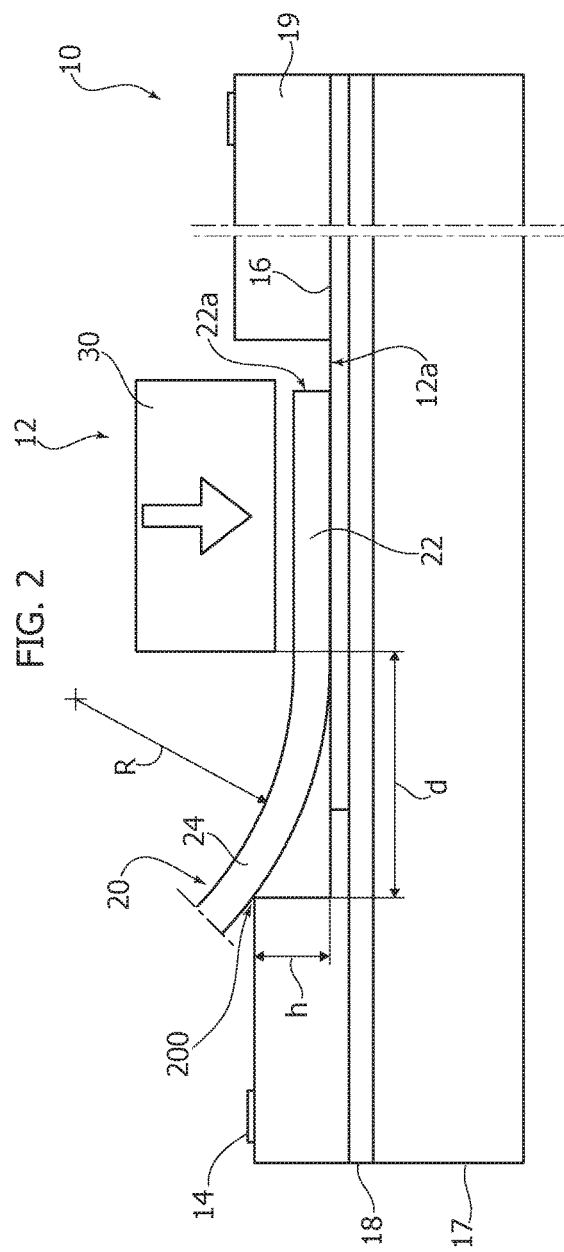
FIG. 2 is a cross sectional view along line II-II of FIG. 1.

In one or more embodiments, attaching the flex 20 to the bottom surface 12a of the cavity 12 may involve using a bonding fixture designated 30 in FIG. 2.

As exemplified in the figures, the flex 20 may be arranged to touch (e.g., as shown at 200) an edge of the cavity 12.

This may facilitate imparting to the flex 20 a curved or bent trajectory with a controlled radius of curvature, e.g., R in FIG. 2. In one or more embodiments, the dimensions of the cavity 12, e.g., the length and thickness (depth), may determine a bending radius R of the optical flex 20.

Also, in one or more embodiments, a terminal distal end 22a of the flex 20 may be arranged at a distance from the peripheral wall of the cavity 12 opposite facing that terminal distal end 22a. In one or more embodiments, the cavity 12 may be longer than an adiabatic coupling region between the optical flex 20 and the optical waveguide(s) 16 of the silicon photonics chip 10.

As exemplified more in detail in FIG. 2, one or more embodiments may include a multi-layered chip 10, including a silicon "handle" or substrate 17, a buried oxide or BOX 18 having the optical waveguide(s) 16 thereon, and a back end of line (BEOL) 19.

In one or more embodiments, the optical flex 20 may include two portions, e.g., a planar portion 22 adiabatically coupled with the waveguide(s) 16 of the chip 10, and a bent portion 24.

In one or more embodiments, the bending radius R of the bent portion 24 of the optical flex 20 may be selected, e.g., in order to facilitate avoiding excess loss.

In one or more embodiments, the bending radius R may be controlled by geometrical constraints, e.g., by the thickness h of the cavity 12 and the distance d between an edge of the cavity 12 (e.g., the one "touched" at 200) and the proximal end of the planar portion 22 of the optical flex 20, e.g., substantially the beginning of the adiabatic coupling region, with the thickness h controlled, e.g., while providing the BEOL 19.

Possible (merely exemplary and non-limiting) quantitative values for an arrangement as exemplified in the figures may include:

an optical flex bending radius R of about 20 mm (this value may be possibly reduced, e.g., down to 5 mm and below);

a cavity thickness h of about 5 microns (1 micron=10−6 m), and a distance d of about 450 microns (1 micron=10−6 m).

One or more embodiments may provide one or more of the following advantages:

a seal ring 14 enclosing the cavity 12 can be provided using conventional functionalities and/or design rules, and/or the bending radius R of the optical flex 20 can be controlled via the geometry of the cavity 12 and the position of the waveguide(s), possibly taking into account the type of bonding fixture used and the flexible material used, and/or the cavity 12 may be provided which is "closed on all sides", that is, forming an enclosed area in the chip 10, thus being adapted to act as a containment tank for glue coupling the flex to the chip, and/or no constraints on the layout of the silicon photonics chip 10 as arising in the case of a cavity being positioned on the edge of the chip.

One or more embodiments may relate to a semiconductor chip (e.g., a silicon photonics chip as exemplified at 10) providing an optical medium for light propagation, the semiconductor chip including a chip surface with an outer perimeter and a cavity (e.g., 12) in the chip surface. The cavity includes a peripheral wall and a bottom surface (e.g., 12a) surrounded by the peripheral wall, the bottom surface adiabatically couplable to an optical waveguide. The cavity extends at a portion of the chip surface distanced from the outer perimeter thereof (that is away from the outer perimeter of the chip surface).

One or more embodiments may include a seal ring (e.g., 14) extending around the cavity between the peripheral wall and the outer perimeter of the chip surface.

In one or more embodiments the seal ring may extend continuously (e.g., as a closed ring) around the cavity, and/or the seal ring and the outer perimeter of the chip surface include pairs of parallel homologous sides (e.g., four sides each as shown in the figures with the pairs each including a side of the outer perimeter of the chip and a side of the seal ring extending parallel thereto).

In one or more embodiments the chip may include at least one substrate (e.g., 17, 18) and an optical waveguide medium (e.g., 16) extending thereon. A back end of line, BEOL structure (e.g., 19) is disposed on at least one substrate and the optical waveguide medium. The cavity is a cavity in the back end of line structure leaving a portion of the optical waveguide medium uncovered. The uncovered portion includes the adiabatically couplable bottom surface.

One or more embodiments may relate to an arrangement including a semiconductor chip according to one or more embodiments, and at least one optical waveguide (e.g., 20) adiabatically coupled to the bottom surface of the cavity in the chip surface.

In one or more embodiments the optical waveguide may include a curved shape with a radius of curvature (e.g., R).

In one or more embodiments, the optical waveguide may touch (e.g., at 200) an edge of the peripheral wall of the cavity, and/or the optical waveguide may include a distal portion (e.g., 22) adiabatically coupled to a portion of the bottom surface of the cavity and a proximal portion (e.g., 24) at a distance (see, e.g., h in FIG. 2) from the bottom surface of the cavity, and/or the optical waveguide may include a terminal distal end (see, e.g., 22a in FIG. 2) arranged at a distance from the peripheral wall of the cavity.

Apparatus according to one or more embodiments may include an arrangement according to one or more embodiments adiabatically coupling a semiconductor chip providing an optical medium for light propagation and at least one optical waveguide.

A method according to one or more embodiments may include providing a semiconductor chip providing an optical medium for light propagation, the semiconductor chip including a chip surface with an outer perimeter, and providing in the chip surface a cavity including a peripheral wall and a bottom surface surrounded by the peripheral wall. The bottom surface is adiabatically couplable to an optical waveguide. The cavity extends at a portion of the chip surface distanced from the outer perimeter thereof.

One or more embodiments may include forming the cavity in the chip surface by etching.

One or more embodiments may include adiabatically coupling at least one optical waveguide to the bottom surface of the cavity in the chip surface.

Without prejudice to the underlying principles, the details and embodiments may vary, even significantly, with respect to what has been disclosed by way of example only, without departing from the extent of protection.

The extent of protection is defined by the annexed claims.

What is claimed is:

1. A semiconductor chip providing an optical medium for light propagation, the semiconductor chip comprising:
   a major exposed surface defining a chip surface having an outer perimeter;
   a back end of line structure disposed over a semiconductor substrate, the back end of line structure defining an integrated circuit;
   an optical waveguide, disposed over the semiconductor substrate, providing an optical input/output for the integrated circuit;
   a cavity disposed in the semiconductor chip extending from the chip surface, wherein the cavity includes a peripheral wall and a bottom surface surrounded by the peripheral wall, the bottom surface of the cavity being adiabatically couplable to a flexible optical waveguide; and
   wherein the cavity is located at an area of the chip surface spaced from the outer perimeter thereof.

2. The semiconductor chip of claim 1, further comprising a seal ring extending around the cavity between the peripheral wall and the outer perimeter of the chip surface.

3. The semiconductor chip of claim 2, wherein the seal ring extends continuously around the cavity.

4. The semiconductor chip of claim 2, wherein the seal ring and the outer perimeter of the chip surface include pairs of parallel homologous sides.

5. The semiconductor chip of claim 1, further comprising:
   wherein the cavity is a cavity in the back end of line structure that does not cover a portion of the optical waveguide, the not covered portion including the adiabatically couplable bottom surface.

6. An apparatus comprising:
   a semiconductor chip according to claim 1; and
   a flexible optical ribbon adiabatically coupled to the optical waveguide, wherein the flexible optical waveguide is the flexible optical ribbon.

7. The apparatus of claim 6, wherein the flexible optical ribbon includes a curved shape with a radius of curvature.

8. The apparatus of claim 6, wherein the flexible optical ribbon touches an edge of the peripheral wall of the cavity.

9. The apparatus of claim 6, wherein the flexible optical ribbon includes a distal portion adiabatically coupled to the optical waveguide and a proximal portion at a distance from the bottom surface of the cavity.

10. The apparatus of claim 6, wherein the flexible optical ribbon includes a terminal distal end arranged at a distance from the peripheral wall of the cavity.

11. A method, comprising:
    providing a semiconductor chip that includes a major exposed surface defining a chip surface having an outer perimeter, a back end of line structure disposed over a semiconductor substrate, the back end of line structure defining an integrated circuit, an optical waveguide, disposed over the semiconductor substrate, providing an optical input/output for the integrated circuit; and
    forming a cavity disposed in the semiconductor chip extending from the chip surface and spaced from the outer perimeter, the cavity including a peripheral wall and a bottom surface surrounded by the peripheral wall, the bottom surface of the cavity being adiabatically couplable to a flexible optical waveguide.

12. The method of claim 11, further comprising forming a seal ring extending around the cavity between the peripheral wall and the outer perimeter of the chip surface.

13. The method of claim 11, wherein forming the cavity in the chip surface comprises etching.

14. The method of claim 11, further comprising adiabatically coupling a flexible optical ribbon to the bottom surface of the cavity in the chip surface, wherein the flexible optical waveguide is the flexible optical ribbon.

15. The method of claim 14, further comprising bending the flexible optical ribbon so as to be supported by one edge of the cavity.

16. A semiconductor chip comprising
    a semiconductor substrate;
    an optical waveguide extending over the semiconductor substrate, providing an optical input/output for the semiconductor chip; and
    an integrated circuit comprising a back end of line structure that overlies the semiconductor substrate, wherein the back end of line structure comprises a cavity that does not cover a portion of the optical waveguide, wherein the cavity includes a peripheral wall and a bottom surface surrounded by the peripheral wall, the bottom surface of the cavity being adiabatically couplable to a flexible optical waveguide; and
    a seal ring extending around the cavity between the peripheral wall and an outer perimeter of the semiconductor chip.

17. The semiconductor chip of claim 16, wherein the seal ring extends continuously around the cavity.

18. The semiconductor chip of claim 16, wherein the seal ring and the outer perimeter of the semiconductor chip include pairs of parallel homologous sides.

19. An apparatus comprising:
    a semiconductor chip according to claim 16; and
    a flexible optical ribbon adiabatically coupled to the bottom surface of the cavity, wherein the flexible optical waveguide is the flexible optical ribbon.

20. The apparatus of claim 19, wherein the flexible optical ribbon includes a curved shape with a radius of curvature.

21. The apparatus of claim 19, wherein the flexible optical ribbon touches an edge of the peripheral wall of the cavity.

22. The apparatus of claim 19, wherein the flexible optical ribbon includes a distal portion adiabatically coupled to a portion of the bottom surface of the cavity and a proximal portion at a distance from the bottom surface of the cavity.

23. The apparatus of claim 19, wherein the flexible optical ribbon includes a terminal distal end arranged at a distance from the peripheral wall of the cavity.

* * * * *